United States Patent [19]

McArthur et al.

[11] Patent Number: 5,640,233
[45] Date of Patent: Jun. 17, 1997

[54] PLATE CORRECTION TECHNIQUE FOR IMAGING SYSTEMS

[75] Inventors: Bruce B. McArthur, San Diego; Robert O. Hunter, Jr., Rancho Santa Fe; Adlai H. Smith, San Diego, all of Calif.

[73] Assignee: Litel Instruments, San Diego, Calif.

[21] Appl. No.: 592,703

[22] Filed: Jan. 26, 1996

[51] Int. Cl.$^6$ ................................................ G01B 9/00
[52] U.S. Cl. ........................................... 356/124; 356/355
[58] Field of Search ..................................... 356/124, 355

[56] References Cited

U.S. PATENT DOCUMENTS 5,392,119  2/1995  McArthur et al. ..................... 356/355

*Primary Examiner*—F. L. Evans
*Attorney, Agent, or Firm*—Townsend and Townsend and Crew LLP

[57] ABSTRACT

A stepper configuration is modified by corrector plates so that an image from a reticle plane is projected to an ideal image at an object plane. The system correction is based on the premise that depth of field correction made at the reticle plane induces insignificant distortion correction. Further, distortion correction in turn induces insignificant changes in field correction. The preferred location of plates correcting for depth of field is therefore at the reticle plane, it being noted that distortion introduced by a field corrector plate at this location is negligible. Three generalized cases for correction are therefore discussed. The first case is field curvature correction where the correcting plate is registered to or close to the reticule plate; it is shown that induced distortion correction may be ignored. The second case is where field correction cannot be placed next to the reticle plate, but the field curvature induced by required distortion correction is negligible. Finally, the case is considered where field curvature induced by the correction of distortion is not negligible and must be compensated for in overall correction.

19 Claims, 2 Drawing Sheets

PLATE CORRECTION TECHNIQUE FOR IMAGING SYSTEMS

This invention relates to the correction of existing optical systems, typically reduction optical systems of the type used in steppers. More particularly, an improvement is disclosed to our Plate Correction of Imaging Systems as set forth in U.S. Pat. No. 5,392,119 issued Feb. 21, 1995.

BACKGROUND OF THE INVENTION

In our U.S. Pat. No. 5,392,119 issued Feb. 21, 1995 entitled Plate Correction of Imaging Systems, we disclosed techniques for the correction of extant imaging systems. It is useful to repeat the Summary of the Invention from our prior disclosure, which is now U.S. Pat. No. 5,392,119. Because of the relevance of this disclosure, we incorporate the specification herein by reference.

An object is projected through the lens system to be corrected to the image plane where the position of the diffraction limited ideal image is readily ascertainable. At least one primary image defect is measured. These aberrations can include but are not limited to distortion, curvature of field, spherical aberration, coma, and astigmatism. Distortion, curvature of field and astigmatism are commonly measured by imaging simple known patterns through the system and analyzing their images. Interferometry can be used to measure the aberrations of the system. Based on non-interferometric measurements, the configuration of an apparent object can be simply computed, based on the optical systems parameters such as the magnification. The apparent object is an imaginary location of the object points which would cause the image of the apparent object through the real system to register to the ideal image. One or more plates and their mounts may be required to achieve the desired optical system performance improvements. The first corrector plate is optimized to produce beam deflection. This deflection is chosen so that rays from the object are given optimal displacement to intersect the desired ray trace path (i.e., the rays from the apparent object) at the second corrector plate to correct for the measured aberrations. The second corrector plate is designed so that rays at the second corrector plate, having been previously displaced to the desired ray trace path, are given the required direction to image at the ideal image. In the analysis offered, provision is made to insert inside the optical system a phase conjugate plate for the correction of (fixed) position independent aberrations, such as spherical abberation. A matrix of test points is utilized to locally measure and correct, on a stepper to stepper basis, lens systems through customized corrector plates individually tailored to each lens system. There results a lens system correctly customized which assists in approaching the diffraction limit of the optical system. Both the process and the product of the process is included in the disclosure.

It will be understood that this patent application particularly applies to optical trains found in steppers. As images in such steppers have been required to provide increasingly improved resolution to ever smaller circuits, the use of the techniques here disclosed enables extant steppers to be corrected and used for imaging beyond the design tolerances of their original fabrication. Further, it will be understood that the disclosed process and product of the process can be utilized for the initial lens train fabrication. In this latter case, production tolerance requirements of the original optical elements can be relaxed with reliance on the corrective process and product of the process herein disclosed.

This corrective process and product of the process has been particularized to that "ray trace" path that an idealized optical system would project, if that optical system is an optimum optical system. In the following disclosure, the particular path that the individual rays trace is not important. Instead, a more generalized correction scheme is set forth.

SUMMARY OF THE INVENTION

A stepper configuration is modified by corrector plates so that an image from a reticle plane is projected to an ideal image at an object plane. The system correction is based on the premise that depth of field correction made at the reticle plane induces significant distortion correction. Further, distortion correction in turn induces significant changes in curvature of field correction. In what follows, we refer to field curvature simply as field. The preferred location of plates correcting for depth of field is therefore at the reticle plane, it being noted that distortion introduced by a field corrector plate at this location is negligible. Three generalized cases for correction are therefore discussed. The first case is field curvature correction where the correcting plate is registered to or close to the reticle plate; it is shown that induced distortion correction may be ignored. The second case is where field correction cannot be placed next to the reticle plate, but the field curvature induced by required distortion correction is negligible. Finally, the case is considered where field curvature induced by the correction of distortion is not negligible and must be compensated for in overall correction.

The current invention is a technique for 2-plate correction of imaging systems with greatly increased ability to correct for curvature of field. General formulas are derived for n-plate correction using this same technique.

Prior work in this area includes U.S. Pat. No. 5,392,119 issued Feb. 21, 1995 entitled Plate Correction of Imaging Systems. As can be understood from the summary contained herein, this patent describes a 2-plate correction technique wherein the direction of rays emanating from the object or reticle plane are constrained to move in the same direction after passing through the correction plates. As contrasted from our prior patent, by relaxing this condition, a manyfold increase in the ability to correct field curvature is enabled.

DESCRIPTION OF THE PREFERRED EMBODIMENT

Figure 1:
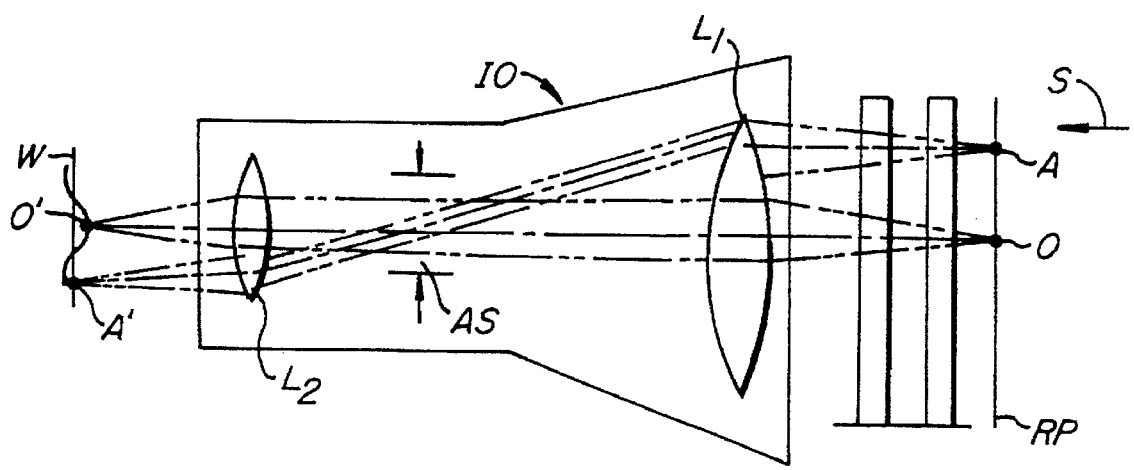
FIG. 1 is a schematic diagram illustrating the physical layout of a reduction imaging system with correction plates of present invention installed.

FIG. 1 is a schematic illustrating physical layout of a reduction imaging system. Reticle plane RP has first object point A and second object point O. Light S from a source not shown projects the image of an object at reticle plane RP through imperfect imaging objective IO. As schematically here shown, imperfect imaging objective IO includes lenses $L_1$ and $L_2$ with aperture stop AS therebetween.

In general, the imaging objective contains more elements than two lenses. For example see Glatzel, E., (1980) "New lenses for microlithography", *SPIE International Lens Design Conference*, Vo. 237, pp 310–320, at FIGS. 4–9.

Further, the present invention can correct reflective or catadioptric imaging systems.

Figures 2, 3:
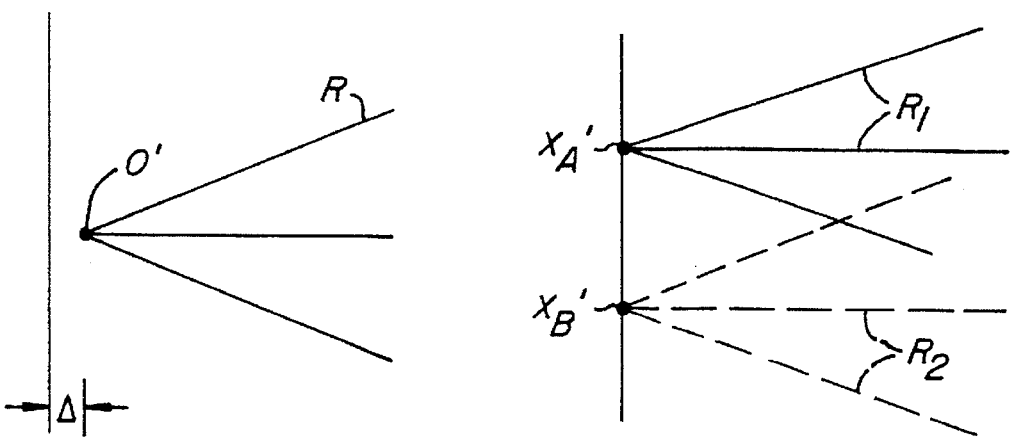
FIG. 2 is a closeup near point O' of FIG. 1.
FIG. 3 is a closeup near point A' of FIG. 1.

Two significant imaging defects are field curvature FC and distortion D. Field curvature FC is the amount of defocus locally experienced by an image is illustrated schematically in FIG. 2. Point O in reticle plane RP, is imaged by imperfect imaging objective IO onto wafer W to point O'. Looking more closely, FIG. 2 shows the region around point O' in the wafer plane but a distance Δ behind it. In this case, we say the field curvature takes on the value

FC=Δ

In general, the rays R do not focus to a point at any plane near W but the plane where their confluence produces a spot of minimum transverse size defines the plane of best focus and hence the field curvature for that point.

Distortion is best understood referring to FIG. 3. FIG. 3 is a blowup around point A' of FIG. 1. Rays $R_1$ focus to point A'. However, the design point for the imaging objective would have the rays $R_1$ not following their present paths but instead following the dashed paths $R_2$ with the result that instead of arriving at A' they arrive at point B' with transverse coordinates $\overline{X}_{B'}$ given by:

$\overline{X}_B = \overline{X}_A/M$ where $\overline{X}_A$ are the transverse coordinates of object point A and M is the design point IO reduction factor, typically 5. The quantity $\overline{D} = \overline{X}_A - \overline{X}_A/M$ is the measure of this defect called distortion.

Figure 4:
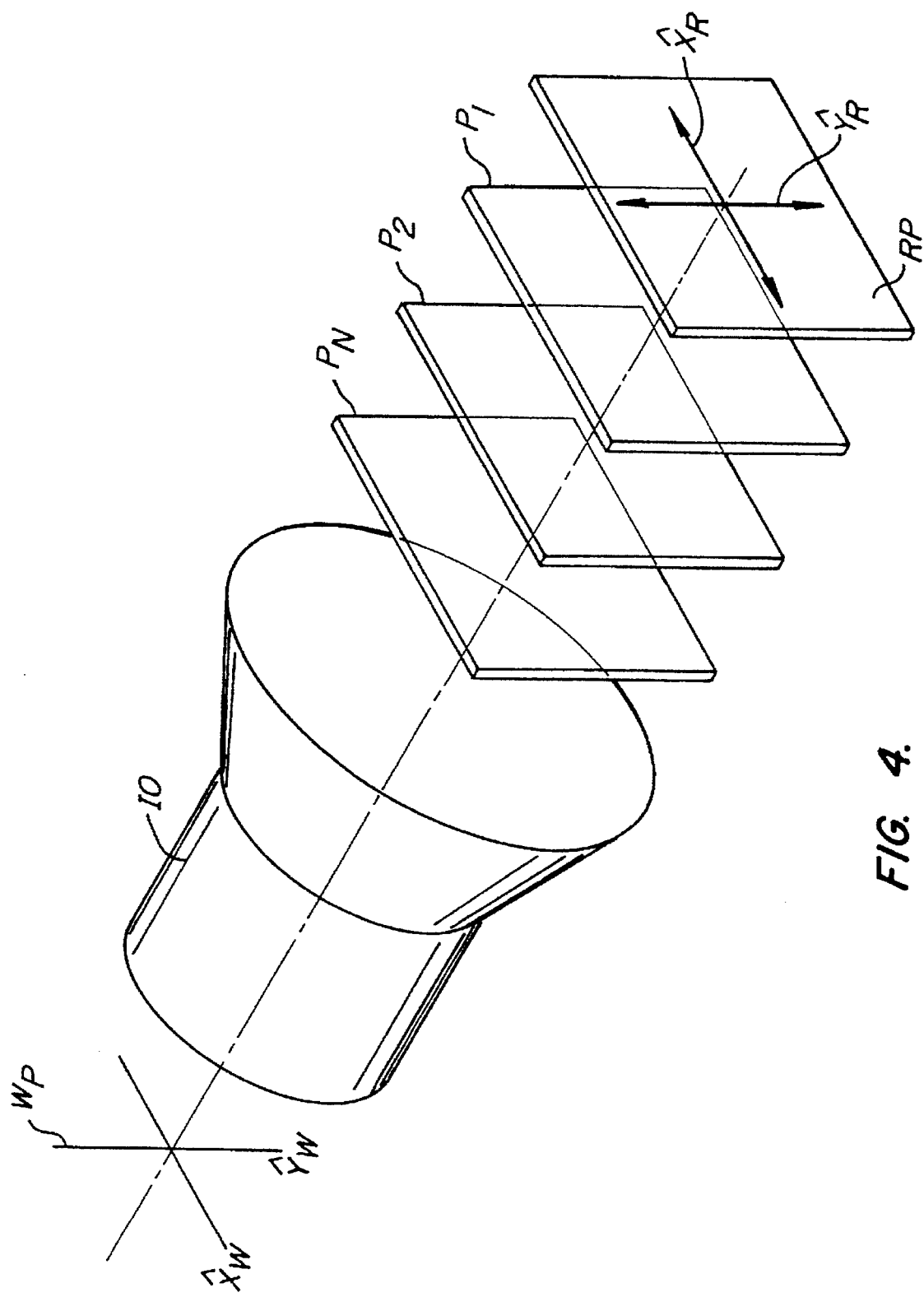
FIG. 4 is a schematic diagram illustrating the coordinate systems and symbols for plate locations.

We now turn to the problem of determining the profiles of plates that will correct for these aberrations. Referring to FIG. 4, inserting plate $P_1$, $P_2$;—$P_{NP}$ each of which has a height profile $H_j(\overline{X}_R)$.

Then the induced net field curvature at wafer due to $N_P$ plates is:

$$FC_W^{IND}\left(\vec{X}_W = \frac{\vec{X}_R}{M}\right) = \sum_{\text{Plates } j=1}^{N_P} \frac{-H_j(\vec{X}_R) * \left(1 - \frac{1}{n}\right)}{M^2} \quad (1)$$

Where:

$H_j$=Increase of plate thickness at $Z^{eff}_j$
M=Image Magnification Ratio.
n=Index of refraction of glass plates.
$\vec{X}_W$=Transverse wafer position
$\vec{X}_R$=Transverse reticle position $Z^{eff}_j$ = corresponding Z − position on a stepper without plates = $Z_j - \left(1 - \frac{1}{n}\right)$ * (Total Thickness of glass plates between $Z_j$ and lens column.)

Thus, when there are 2 plates $P_1+P_2$ with contoured sides toward the reticle, $Z^{eff}_1 = Z_1 - \left(1 - \frac{1}{n}\right) \cdot (t_1 + t_2)$ -continued $Z^{eff}_2 = Z_2 - \left(1 - \frac{1}{n}\right) \cdot (t_2)$ where $t_1/t_2$ is the nominal thickness of plate $P_1/P_2$ and $Z_1/Z_2$ is the distance between the unmodified stepper's reticle position and the first/second plate's contoured surface. The induced net distortion at the wafer is then:

$$\vec{D}_W^{ind}\left(\vec{X}_W = \frac{\vec{X}_R}{M}\right) = \sum_{j=1}^{N_P} \frac{\vec{\nabla} H_j(\vec{X}_R) * Z^{eff}_j * (n-1)}{M} \quad (2)$$

For most any reasonable system:

A. The field curvature induced by the distortion correcting contributions to the plate will be negligible; and, B. The distortion induced by the field curvature correcting contributions will be appreciable unless the field curvature correction plate is placed very close to the reticle.

In the general case, it is therefore required to compute field curvature first, then compute the distortion correction due to the original error plus the distortion due to the plate that predominately corrects the field curvature.

Empirically, the measured distortion of steppers will contain a curl component that cannot be removed with this technique. Below, the measured distortion with the curl component removed will be referred to as $\vec{D}_W^{Meas} = \vec{Dist}_W^{Meas} - \vec{Curl}^{Meas}$ where $\vec{Dist}_W^{Meas}$ is the raw, measured distortion and $\vec{Curl}^{Meas}$ is the curl component in $\vec{Dist}_W^{Meas}$ In the following specification, reference is made to the measurement of curvature of field, and distortion. Incorporation by reference of U.S. Pat. No. 5,392,119 issued Feb. 21, 1995 entitled Plate Correction of Imaging Systems is made. In that Patent, a full discussion of these measurements may be found, especially with reference to FIGS. 1A, 1B, 2A and 2B of that referenced '119 Patent. Such a detailed discussion will not be repeated herein.

Assuming that such measurements are made, the following specification continues.

Consider three illustrative cases (1), (2) and (3) of increasing complexity:

Case (1) Field curvature corrector [$H_1$] is placed next to (or very near to) reticle plate:

$$H_1^{(1)}(\vec{X}_R) = \frac{M^2}{\left(1 - \frac{1}{n}\right)} * FC_W^{Meas}\left(\vec{X}_W = \frac{\vec{X}_R}{M}\right) \quad (3)$$

and $H_2^{(1)}(\vec{X}_R)$ is determined from $$\vec{\nabla} H_2^{(1)}(\vec{X}_R) \approx \frac{-M}{(n-1) * Z^{eff}_2} * \vec{D}_W^{Meas}\left(\vec{X}_W = \frac{\vec{X}_R}{M}\right) \quad (4)$$

where:

$FC_W^{Meas}$ and $\vec{D}_W^{Meas}$ are the original field curvature and distortion of the optical system to be corrected $FC_W^{Meas}$ and $\vec{D}_W^{Meas}$ are both measured at the wafer.

Case (2): Field corrector [H1] cannot be placed next to the reticle plate, but the field curvature induced by correcting the original distortion is negligible.

$$H_1^{(2)}(\vec{X}_R) = \qquad (5)$$

$$\left[\frac{M^2}{\left(1-\frac{1}{n}\right)} FC_W^{Meas}\left(\vec{X}_W = \frac{\vec{X}_R}{M}\right) * \frac{1}{\left(1-\frac{Z_1^{eff}}{Z_2^{eff}}\right)}\right]$$

and $$H_2^{(2)}(\vec{X}_R) = H_2^{(1)}(\vec{X}_R) - \qquad (6)$$

$$\left(\frac{Z_1^{eff}}{Z_2^{eff}}\right) \frac{M^2}{\left(1-\frac{1}{n}\right)} FC_W^{Meas}\left(\vec{X}_W = \frac{\vec{Y}_R}{M}\right) * \frac{1}{\left(1-\frac{Z_1^{eff}}{Z_2^{eff}}\right)}$$

then the net field curvature induced at the wafer is given by:

$$FC_W^{IND} = \frac{-\left(1-\frac{1}{n}\right)}{M^2} *$$

$$\frac{M^2}{\left(1-\frac{1}{n}\right)} FC_W^{Meas} \left[\frac{1}{\left(1-\frac{Z_1^{eff}}{Z_2^{eff}}\right)} - \frac{\frac{Z_1^{eff}}{Z_2^{eff}}}{1-\frac{Z_1^{eff}}{Z_2^{eff}}}\right] + \frac{\left(1-\frac{1}{N}\right)}{M^2} H_2^{(1)}$$

Then $$FC_W^{IND} = -FC_M^{Meas} + \text{Negligible}$$

and the net distortion induced is:

$$DIST_W^{IND} = \frac{M^2}{\left(1-\frac{1}{N}\right)} \frac{1}{\left(1-\frac{Z_1^{eff}}{Z_2^{eff}}\right)} \left(\vec{\nabla}FC_W^{Meas} * Z_1^{eff} - \frac{Z_1^{eff}}{Z_2^{eff}} \vec{\nabla}FC_W^{Meas} Z_2^{eff}\right) + \vec{\nabla}H_2^{(1)} \frac{Z_2(N-1)}{M} \qquad (7)$$

and then $$DIST_W^{ind} = \vec{\nabla}H_2^{Case1} Z_2^{eff} \frac{n-1}{M} \approx \qquad (8)$$

$$\frac{-M}{(N-1)Z_2^{eff}} * Z_2^{eff} \frac{(n-1)}{M} \vec{D}_W^{Meas} = -\vec{D}_W^{Meas}$$

thus the induced field correction (FC) and distortion (DIST) approximately cancel and correct the measured errors.

Case (3): The field curvature induced by the correction of the distortion is NOT negligible.

$$H_1^{(3)}(X_R) = H_1^{(2)}(\vec{X}_R) + \Phi_D(\vec{X}_R) * \frac{M}{n-1} \frac{1}{Z_2^{eff} - Z_1^{eff}}$$

where $\Phi_D(\vec{x}_R)$ is a scalar function is constructed from the curl removed, measured distortion field such that $$\vec{\nabla}\Phi_D(\vec{X}_R) =$$

$$\vec{D}_W^{meas}\left(\vec{X}_W = \frac{\vec{X}_R}{M}\right) = \overrightarrow{DIST^{MEAS}}\vec{X}_W - \overrightarrow{CURL^{MEAS}}(\vec{X}_W)$$

The function $\Phi_D$ can be determined using any of a number of solvers found in the literature. (See Wallner, E., (1983), "Optimal wave-front correction using slope measurements", *J. Opt. Soc. Am.*, Vol. 73, No. 12, pp. 1771–1779, for an example of techniques used for computing a function when we know the values of its gradient at a discrete set of points.) This final case is the most general and widely applicable solution covered under this approach.

While this invention has been explained with reference to a 2 plate correction of field curvature and distortion it is understood that different numbers of plates could also be used.

The reader will understand that the radiation source can be of many forms. It can be in visible light, ultraviolet, soft X-ray. Further, the radiation can be monochromatic, nearly monochromatic, or in some case broad band. Further, the discrete corrector plates can be on either side of a single optic.

The plates can admit of modification. Diffractive elements can be used. Further the location of the corrector plates can vary. They can be within or without the imaging system. They could be reflective.

What is claimed is:

1. A process of altering and improving image quality of an image projected through an image system from an object at a reticle plane to an actual image of the object at an image plane relative to an ideal image of the object at an ideal image plane comprising the steps of:

providing a radiation source;

illuminating the object with the radiation source;

projecting an actual image of the object along a projection axis through the image system to the ideal image plane where position of a diffraction limited ideal image is readily ascertainable relative to the actual image of the object;

measuring at least curvature of field, and distortion, and local astigmatism of the image system relative to the diffraction limited ideal image to determine the image system performance for a matrix of distributed field points through the image system;

providing at least two spaced apart corrector plate mounting planes substantially normal to the projection axis of the image system for insertion of a first corrector plate and insertion of a second corrector plate within the object to image optical path;

placing a depth of field corrector plate at one spaced apart corrector plate mounting plane near to the reticle plane; and, placing a distortion corrector plate at another spaced apart corrector plate mounting plane removed from the reticle plane; and, accounting for field curvature input from distortion corrector plate at another spaced apart corrector plate mounting plane removed from the reticle plane.

2. The process of claim 1 and wherein:
said radiation source emits radiation in a visible wavelength regime.
3. The process of claim 1 and wherein:
said radiation source emits radiation in ultraviolet wavelength regime.
4. The process of claim 1 and wherein:
said radiation source emits radiation in soft x-ray wavelength regime.
5. The process of claim 2 and wherein:
said radiation source is monochromatic.
6. The process of claim 2 and wherein:
said radiation source is nearly monochromatic.
7. The process of claim 2 and wherein:
said radiation source is broad band.
8. The process of claim 1 and wherein:
said first corrector plate and said second corrector plate are equivalent to a first surface and a second surface of a single optic.
9. The process of claim 1 and including:
designing a third corrector plate to further coincide the actual image and the diffraction limited ideal image; and,
inserting the third corrector plate into a corrector plate mounting plane.
10. The process of claim 1 and wherein:
one of said corrector plates includes provision for the correction of repeatable error within said imaging system.
11. The process of claim 1 and wherein:
at least one of said corrector plates include a diffractive element.
12. The process of claim 1 and wherein:
one of said corrector plates is located within said imaging system; and,
one of said corrector plates is located without said imaging system.
13. The process of claim 1 and wherein:
at least two corrector plates are located within said imaging system.
14. The process of claim 1 and wherein:
at least two corrector plates are located without said imaging system.
15. A process of altering and improving image quality of an image projected through an image system from an object at a reticle plane to an actual image of the object at an image plane relative to an ideal image of the object at an ideal image plane comprising the steps of:
providing a radiation source;
illuminating the object with the radiation source;
projecting an actual image of the object along a projection axis through the image system to the ideal image plane where position of a diffraction limited ideal image is readily ascertainable relative to the actual image of the object;
measuring at least curvature of field, and distortion of the image system relative to the diffraction limited ideal image to determine the image system performance for a matrix of distributed filed points through the image system;
providing at least two spaced apart corrector plate mounting planes substantially normal to the projection axis of the image system for insertion of a first corrector plate and insertion of a second corrector plate within the object to image optical path;
placing a depth of field corrector plate at one spaced apart corrector plate mounting plane near to the reticle plane;
placing a distortion corrector plate at another spaced apart corrector plate mounting plane removed from the reticle plane;
determining the field corrector plate thickness according to the relationship:

$$H_1^{(1)}(\vec{X}_R) = \frac{M^2}{\left(1 - \frac{1}{n}\right)} * FC_W^{Meas}\left(\vec{X}_W = \frac{\vec{X}_R}{M}\right) \quad (3)$$

and $H_2^{(1)}(\vec{X}_R)$ is determined from $$\vec{\nabla} H_2^{(1)}(\vec{X}_R) \approx \frac{-M}{(n-1) * Z_j^{eff}} * \vec{D}_W^{Meas}\left(\vec{X}_W = \frac{\vec{X}_R}{M}\right) \quad (4)$$

where:

$FC_W^{Meas}$ and $\vec{D}_W^{Meas}$ are the original field curvature and distortion of the optical system to be corrected $FC_W^{Meas}$ and $\vec{D}_W^{Meas}$ are both measured at the ideal image plane
where:
$H_j$=Increase of plate thickness at $Z_j^{eff}$
M=Image Magnification Ratio.
n=Index of refraction of glass plates.
$\vec{X}_W$=Transverse ideal image position
$\vec{X}_R$=Transverse reticle position $Z_j^{eff}$ = corresponding Z − position on a stepper without plates =

$$Z_j - \left(1 - \frac{1}{n}\right) * \text{(Total Thickness of glass}$$

plates between $Z_j$ and lens column); and, ignoring field curvature input from distortion corrector plate.
16. A process of altering and improving image quality of an image projected through an image system from an object at a reticle plane to an actual image of the object at an image plane relative to an ideal image of the object at an ideal image plane comprising the steps of:
providing a radiation source;
illuminating the object with the radiation source;
projecting an actual image of the object along a projection axis through the image system to the ideal image plane where position of a diffraction limited ideal image is readily ascertainable relative to the actual image of the object;
measuring at least curvature of field, and distortion of the image system relative to the diffraction limited ideal image to determine the image system performance for a matrix of distributed filed points through the image system;

providing at least two spaced apart corrector plate mounting planes substantially normal to the projection axis of the image system for insertion of a first corrector plate and insertion of a second corrector plate within the object to image optical path;

placing a depth of field corrector plate at one spaced apart corrector plate mounting plane remote from the reticle plane; and, placing a distortion corrector plate at another spaced apart corrector plate mounting plane removed from the reticle plane; and, ignoring field curvature input from distortion corrector plate where:

$$H_1^{(2)}(\vec{X}_R) = \left[ \frac{M^2}{\left(1-\frac{1}{n}\right)} FC_W^{Meas}\left(\vec{X}_W = \frac{\vec{X}_R}{M}\right) * \frac{1}{\left(1-\frac{Z_1^{eff}}{Z_2^{eff}}\right)} \right] \tag{5}$$

and $$H_2^{(2)}(\vec{X}_R) = H_2^{(1)}(\vec{X}_R) - \left(\frac{Z_1^{eff}}{Z_2^{eff}}\right)\frac{M^2}{\left(1-\frac{1}{n}\right)} FC_W^{Meas}\left(\vec{X}_W = \frac{\vec{Y}_R}{M}\right) * \frac{1}{\left(1-\frac{Z_1^{eff}}{Z_2^{eff}}\right)} \tag{6}$$

then the net field curvature induced at a wafer is given by:

$$FC_W^{IND} = \frac{-\left(1-\frac{1}{n}\right)}{M^2} * \frac{M^2}{\left(1-\frac{1}{n}\right)} FC_W^{Meas} \left[ \frac{1}{\left(1-\frac{Z_1^{eff}}{Z_2^{eff}}\right)} - \frac{\frac{Z_1^{eff}}{Z_2^{eff}}}{1-\frac{Z_1^{eff}}{Z_2^{eff}}} \right] + \frac{\left(1-\frac{1}{N}\right)}{M^2} H_2^{(1)}$$

then $$FC_W^{IND} = -FC_M^{Meas} + \text{Negligible}$$

and the net distortion induced is:

$$DIST_W^{IND} = \frac{M^2}{\left(1-\frac{1}{N}\right)} \frac{1}{\left(1-\frac{Z_1^{Eff}}{Z_2^{Eff}}\right)} \left( \vec{\nabla} FC_W^{Meas} * Z_1^{Eff} - \frac{Z_1^{Eff}}{Z_2^{Eff}} \vec{\nabla} FC_W^{Meas} Z_2^{Eff} \right) + \vec{\nabla} H_2^{(2)} \frac{Z_2(N-1)}{M} \tag{7}$$

and then $$DIST_W^{Ind} = \vec{\nabla} H_2^{Case1} Z_2^{Eff} \frac{n-1}{M} \approx \tag{8}$$

-continued $$\frac{-M}{(N-1)Z_2^{Eff}} * Z_2^{eff} \frac{(n-1)}{M} \vec{D}_W^{Meas} = -\vec{D}_W^{Meas}$$

thus the induced field correction (FC) and distortion (DIST) approximately cancel and correct the measured errors, where:

$H_j$=Increase of plate thickness at $Z^{eff}_j$
M=Image Magnification Ratio
n=Index of refraction of glass plates
$\vec{X}_W$=Transverse wafer position
$\vec{X}_R$=Transverse reticle position $Z_j^{eff}$ = corresponding Z – position on a stepper without plates =

$$= Z_j - \left(1 - \frac{1}{n}\right) * \text{(Total Thickness of glass plates between } Z_j \text{ and lens column)}.$$

17. A process of altering and improving image quality of an image projected through an image system from an object at a reticle plane to an actual image of the object at an image plane relative to an ideal image of the object at an ideal image plane comprising the steps of:

providing a radiation source;

illuminating the object with the radiation source;

projecting an actual image of the object along a projection axis through the image system to the ideal image plane where position of a diffraction limited ideal image is readily ascertainable relative to the actual image of the object;

measuring at least curvature of field, and distortion of the image system relative to the diffraction limited ideal image to determine the image system performance for a matrix of distributed filed points through the image system;

providing at least two spaced apart corrector plate mounting planes substantially normal to the projection axis of the image system for insertion of a first corrector plate and insertion of a second corrector plate within the object to image optical path;

placing a depth of field corrector plate at one spaced apart corrector plate mounting plane remote from the reticle plane; and, placing a distortion corrector plate at another spaced apart corrector plate mounting plane removed from the reticle plane;

compensating for the input of the depth of field correction of the distortion corrector plate according to:

$$H_1^{(3)}(\vec{X}_R) = H_1^{(2)}(\vec{X}_R) + \Phi_D(\vec{X}_R) * \frac{M}{n-1} \frac{1}{Z_2^{eff} - Z_1^{eff}}$$

where $\Phi_D(\vec{X}_R)$ is a scalar function constructed from the curl removed, measured distortion field such that $$\vec{\nabla}\Phi_D(\vec{X}_R) = \vec{D}_W^{meas}(\vec{X}_W = \vec{X}_R M) = \vec{DIST}^{MEAS}(\vec{X}_W) - \vec{CURL}^{MEAS}(\vec{X}_W)$$

where:

$H_j$=Increase of plate thickness at $Z^{eff}_j$
M=Image Magnification Ratio n = Index of refraction of glass plates $\vec{X}_W$ = Transverse wafer position $\vec{X}_R$ = Transverse reticle position $Z_j^{eff}$ = corresponding Z − position on a stepper without plates =

$$= Z_j - \left(1 - \frac{1}{n}\right) * \text{(Total Thickness of glass plates between } Z_j \text{ and lens column)}.$$

18. The process of claim 17 and wherein:

one of said corrector plates is placed in the middle of said system and includes provision of for the correction of repeatable error within said imaging system.

19. The process of claim 18 and wherein:

both said plates are without said imaging system.

* * * * *